US011851785B2

(12) United States Patent
Clarke et al.

(10) Patent No.: US 11,851,785 B2
(45) Date of Patent: Dec. 26, 2023

(54) ALUMINUM NITRIDE PASSIVATION LAYER FOR MERCURY CADMIUM TELLURIDE IN AN ELECTRICAL DEVICE

(71) Applicant: Raytheon Company, Waltham, MA (US)

(72) Inventors: Andrew Clarke, Santa Barbara, CA (US); David R. Rhiger, Goleta, CA (US); George Grama, Lompoc, CA (US); Stuart B. Farrell, Goleta, CA (US)

(73) Assignee: Raytheon Company, Waltham, MA (US)

( * ) Notice: Subject to any disclaimer, the term of this patent is extended or adjusted under 35 U.S.C. 154(b) by 253 days.

(21) Appl. No.: 17/326,615

(22) Filed: May 21, 2021

(65) Prior Publication Data

US 2022/0372651 A1 Nov. 24, 2022

(51) Int. Cl.
*H01L 31/18* (2006.01)
*C30B 25/18* (2006.01)
(Continued)

(52) U.S. Cl.
CPC .......... *C30B 25/183* (2013.01); *C30B 29/403* (2013.01); *C30B 29/605* (2013.01); *H01L 31/1832* (2013.01); *H01L 31/1868* (2013.01)

(58) Field of Classification Search
CPC ... C30B 25/183; C30B 29/403; C30B 29/605; H01L 31/1832; H01L 31/1868; H01L 31/1032
See application file for complete search history.

(56) References Cited

U.S. PATENT DOCUMENTS 5,365,088 A 11/1994 Myrosznyk
5,959,340 A 9/1999 Wan
(Continued)

FOREIGN PATENT DOCUMENTS

EP 0635892 B1 6/2002
WO 2007096405 A1 8/2007
(Continued)

OTHER PUBLICATIONS

R. Singh, A.K. Gupta and K.C. Chhabra, "Surface Passivation of Mercury-Cadmium-Telluride Infrared Detectors", Def. Sci. J., vol. 41, No. 3, Jul. 1991, pp. 205-239.
(Continued)

*Primary Examiner* — David Vu
*Assistant Examiner* — Brandon C Fox
(74) *Attorney, Agent, or Firm* — Renner, Otto, Boisselle & Sklar

(57) ABSTRACT

An electrical device includes an aluminum nitride passivation layer for a mercury cadmium telluride ($Hg_{1-x}Cd_xTe$) (MCT) semiconductor layer of the device. The AlN passivation layer may be an un-textured amorphous-to-polycrystalline film that is deposited onto the surface of the MCT in its as-grown state, or overlying the MCT after the MCT surface has been pre-treated or partially passivated, in this way fully passivating the MCT. The AlN passivation layer may have a coefficient of thermal expansion (CTE) that closely matches the CTE of the MCT layer, thereby reducing strain at an interface to the MCT. The AlN passivation layer may be formed with a neutral inherent (residual) stress, provide mechanical rigidity, and chemical resistance to protect the MCT.

20 Claims, 4 Drawing Sheets

(51) Int. Cl.
*C30B 29/40* (2006.01)
*C30B 29/60* (2006.01)

(56) References Cited

U.S. PATENT DOCUMENTS

| | | | |
|---|---|---|---|
| 7,564,057 | B1 | 7/2009 | Yamazaki |
| 8,481,376 | B2 | 7/2013 | Saxler |
| 8,808,513 | B2 | 8/2014 | Laptev |
| 9,412,902 | B2 | 8/2016 | Shatalov |
| 10,515,905 | B1 | 12/2019 | Rondon |
| 11,410,937 | B2 | 8/2022 | Clarke |
| 2003/0013218 | A1 | 1/2003 | Chason |
| 2011/0140242 | A1 | 6/2011 | Ramdani |
| 2013/0296158 | A1 | 11/2013 | Cao |
| 2014/0110754 | A1 | 4/2014 | Jain |
| 2021/0249462 | A1* | 8/2021 | Huang .............. H01L 27/14634 |
| 2021/0280531 | A1* | 9/2021 | Clarke .............. H01L 21/32051 |
| 2022/0013555 | A1* | 1/2022 | Krueger .................. H01L 28/91 |
| 2022/0285298 | A1* | 9/2022 | Clarke .............. H01L 27/14649 |
| 2022/0367740 | A1 | 11/2022 | Clarke |

FOREIGN PATENT DOCUMENTS

| | | | |
|---|---|---|---|
| WO | 2016209282 | A1 | 12/2016 |
| WO | 2021178031 | A1 | 9/2021 |

OTHER PUBLICATIONS

S.K. Jha et al., "Bake stability of CdTe and ZnS on HgCdTe: An x-ray photoelectron spectroscopy study", J. Elect. Mat. Aug. 2003, vol. 32(8), pp. 899-905.

PhD Thesis of Jing Zhang, "A Fundamental Study of Interface Effects in HgCdTe Materials and Devices", 2015, University of Western Australia.

Butcher et al, "Predeposition 1-9, 14, ultraviolet treatment for adhesion 15, 17-20 improvement of thin films on mercury cadmium telluride," Journal of Vacuum Science, American Institute of Physics, 2 Huntington Quadrangle, Melville, NY 11747, vol. 19, No. 1, Jan. 1, 2001, pp. 90-96.

International Search Report and Written Opinion dated Aug. 10, 2022 in corresponding International Application No. PCT/US2022/026702.

Venkatara et al, "Structural, optical and mechanical properties of aluminum nitride films prepared by reactive DC magnetron sputtering," Thin Solid Films, Elsevier, Amsterdam, NL, vol. 502, No. 1-2 , Apr. 28, 2006, pp. 235-239.

Ryu, et al., "Stress-Induced Delamination of Through Silicon via Structures", AIP Conf. Proc. 1378, 153 (2011).

Zhao, et al., "Effect of Thermal Mechanical Behaviors of Cu on Stress Distribution in Cu-Filled Through-Silicon Vias Under Heat Treatment", J. Elect. Mat. 47, 142-147 (2018).

Reed et al., "Tensile Strength and Ductility of Indium", (NIST), Mat. Sci. and Eng. A, 102 (1988) 227-236.

Cheng, et al., "Mechanical Response of Indium Micro-joints to Low Temperature Cycling", 2009 Electronic Components and Technology Conference, p. 1792-1795.

Zhang et al., "Characterization of nanoscale chips and a novel model for face nanogrinding on softbrittle HgCdTe films", Tribol, Lett. 49, 203-215 (2013).

Felmetsger et al., "Stress Control in AlN and Mo Films for Electro-Acoustic Devices", Conference Paper, Jun. 2008 DOI: 10.1109/FREQ.2008.4623076 Source: IEEE Xplore.

Lang et al.; "Stress compensation techniques in thin layers applied to silicon micromachining"; MRS Online Proceedings Library Archive 284; 1992; Abstract only.

Mackenzie et al.; "Stress control of Si-based PECVD dielectrics"; Proceedings of the 207th Electrochemical Society Meeting; 2005.

Panda et al.; "Reduction of residual stress in AlN thin films synthesized by magnetron sputtering technique." Materials Chemistry and Physics 200 (2017): 78-84.

\* cited by examiner

ALUMINUM NITRIDE PASSIVATION LAYER FOR MERCURY CADMIUM TELLURIDE IN AN ELECTRICAL DEVICE

TECHNICAL FIELD

The present invention relates generally to electrical devices, and more particularly to an electrical device with an aluminum nitride passivation layer for mercury cadmium telluride, such as for a photodetector device.

BACKGROUND

Mercury cadmium telluride ($Hg_{1-x}Cd_xTe$) is well-known as a material for use in infrared devices, such as detectors, sources, LEDs, negative luminescence devices, etc. Mercury cadmium telluride, often referred to as "MCT," is a semiconductor alloy, the bandgap of which can be varied by altering the composition of the alloy. The band gap may be tuned so that the MCT can be used for a range of infrared devices covering short wave (SW), medium wave (MW), long wave (LW) and very long wave (VLW) infrared wavelengths. MCT is the material of choice for many infrared focal plane array applications. Low leakage current and high carrier mobility of MCT results in detectors with excellent sensitivity. MCT also is a favorable solution for single and multi-band systems covering a wide range of wavelengths because it is possible to tune the wavelength by selecting the appropriate composition. It is also possible to design and grow structures where the composition is tuned so that two or more wavelengths are operational within a single device.

A typical fabrication method for infrared devices involves growing MCT epitaxially onto a crystalline substrate, and then forming the semiconductor device by Mesa etching, ion implantation, or ion beam milling. One such method for epitaxially growing MCT is molecular beam epitaxy (MBE). The MCT layer may be doped with a suitable dopant which may be n-type or p-type. A passivation layer is provided to form an interface with the MCT layer to ensure electrical stability of the device and which may prevent loss of mercury from the material. Metal contacts are then formed on the device, and the device is bonded to a read out integrated circuit.

SUMMARY

One problem with MCT-based electrical devices of the type described above is that the passivation layer interface can be a major source of dark current. Aside from the MCT surface preparation process preceding formation of the passivation layer, the passivation layer itself generally should adhere well to MCT, be a good insulator, exhibit low fixed charge, be stable over time and air exposure, not be attacked by chemicals used for fabrication, be sufficiently non-porous to prevent gas diffusion and contamination, and produce an interface that is sufficiently electrically inert so that it does not degrade operation. In addition, the passivation layer should not induce significant interface strain, which can lead to crystal defects in the MCT that provide sources of carrier generation-recombination.

An aspect of the present disclosure provides an aluminum nitride ($AlN_x$) passivation layer for MCT which overcomes one or more deficiencies of conventional passivation layers.

Generally, the aluminum nitride passivation layer may have one or more of the following advantages: (i) a small lattice constant and disoriented grain structure of such passivation film can eliminate the possibility of epitaxy and misfit strain at the interface, (ii) aluminum nitride has a similar coefficient of thermal expansion (CTE) as MCT, eliminating interface strain from CTE mismatch, (iii) aluminum nitride's chemical inertness in relation to Hg, Cd, and Te eliminates thermodynamic drivers for reduction reactions and the problematic creation of free Hg near the interface (adhesion, unintentional doping, conduction), (iv) aluminum nitride's large bandgap (about 6.2 eV) and high dielectric constant (about k=9) make it an excellent electrical insulator, (v) aluminum nitride is a good barrier to water vapor and other gases, (vi) aluminum nitride has high rigidity which makes it mechanically protective, and (vii) aluminum nitride has very high thermal conductivity.

According to an aspect, the aluminum nitride passivation layer is an un-textured amorphous-to-polycrystalline film with neutral inherent (residual) stress that is deposited onto the surface of the MCT in its as-grown state, or overlying the MCT after the MCT surface has been pre-treated or partially passivated, in this way fully passivating the MCT.

According to an aspect, the aluminum nitride passivation layer is configured to reduce strain-induced defect density by providing an interface free of lattice misfit and CTE mismatch strain.

According to an aspect, the aluminum nitride passivation layer is chemically and electrically inert with respect to MCT, and protects the MCT from degradation by Hg diffusion, moisture, or gas exposure while providing electrical insulation.

According to an aspect, the aluminum nitride passivation layer provides a rigid layer of protection to the fragile MCT layer.

According to an aspect, the aluminum nitride passivation layer provides a suitable adherent surface for application of conductors or bonding layers, such as a bonding oxide layer.

According to an aspect, the aluminum nitride passivation layer is compatible with other fabrication processes for manufacturing the electrical device.

According to an aspect, the aluminum nitride passivation layer provides excellent transmittance of infrared radiation over the range of wavelengths desired for a photodetector device (e.g., 3-14 um).

According to an aspect, an electrical device includes: a mercury cadmium telluride ($Hg_{1-x}Cd_xTe$) layer; and a passivation layer overlying the mercury cadmium telluride layer; wherein the passivation layer includes an aluminum nitride ($AlN_x$) passivation layer.

According to an aspect, a mesa structure semiconductor device includes: a substrate, a mercury cadmium telluride ($Hg_{1-x}Cd_xTe$) layer overlying the substrate, the mercury cadmium telluride layer comprising a plurality of mesas each comprising at least one p-n junction; a passivation layer overlying and interfacing directly against the mercury cadmium telluride layer; and a plurality of metal contacts interfacing directly against the mercury cadmium telluride layer atop each of the plurality of mesas; wherein the passivation layer includes a cadmium telluride (CdTe) passivation layer and an aluminum nitride ($AlN_x$) passivation layer; and wherein the cadmium telluride passivation layer overlies and directly interfaces against the mercury cadmium telluride layer, and the aluminum nitride passivation layer overlies and interfaces directly against the cadmium telluride passivation layer.

According to an aspect, a method of forming an electrical device includes: providing a substrate; forming a mercury cadmium telluride ($Hg_{1-x}Cd_xTe$) layer overlying the substrate; and forming an aluminum nitride ($AlN_x$) layer as a passivation layer overlying the mercury cadmium telluride layer.

The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

The principles and aspects according to the present disclosure have particular application to electrical devices, such as integrated circuit (IC) devices, and more particularly semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide an aluminum nitride passivation layer for overcoming deficiencies of conventional passivation layers, particularly for MCT. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to integrating both active and passive electrical devices.

As noted above, one problem with passivation layers for semiconductors, and particularly passivation layers for mercury cadmium telluride ($Hg_{1-x}Cd_xTe$) ("MCT") material, is that the passivation layer interface can be a major source of dark current. Accordingly, an aspect of the present disclosure provides an aluminum nitride ($AlN_x$) passivation layer for MCT which overcomes one or more deficiencies of conventional passivation layers.

Figure 1:
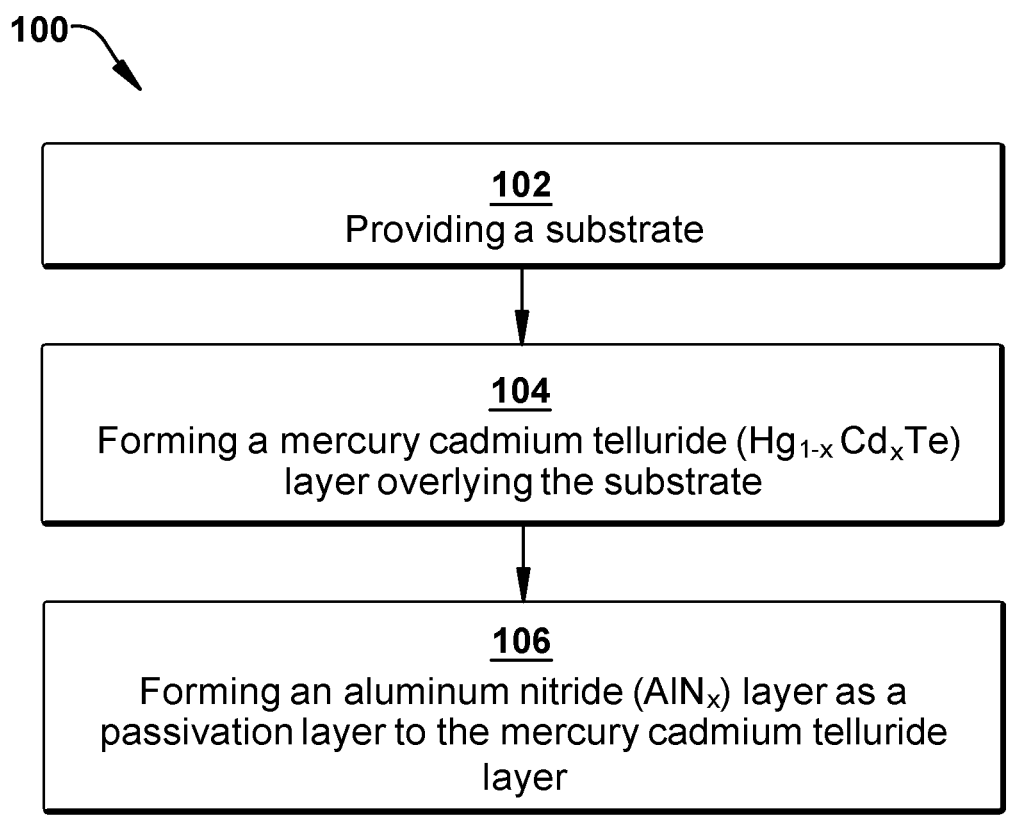
FIG. 1 is a flow chart showing at least a portion of an exemplary method of fabricating an exemplary electrical device according to an embodiment.

FIG. 1 depicts an exemplary method 100 for forming an exemplary electrical device, such as a photodetector semiconductor device, according to an embodiment. As shown, the method generally includes the steps of: providing a substrate of the electrical device (step 102), forming a mercury cadmium telluride ($Hg_{1-x}Cd_xTe$) ("MCT") layer overlying the substrate (step 104), and forming an aluminum nitride ($AlN_x$) layer as a passivation layer to the MCT layer (step 106).

Figure 2A:
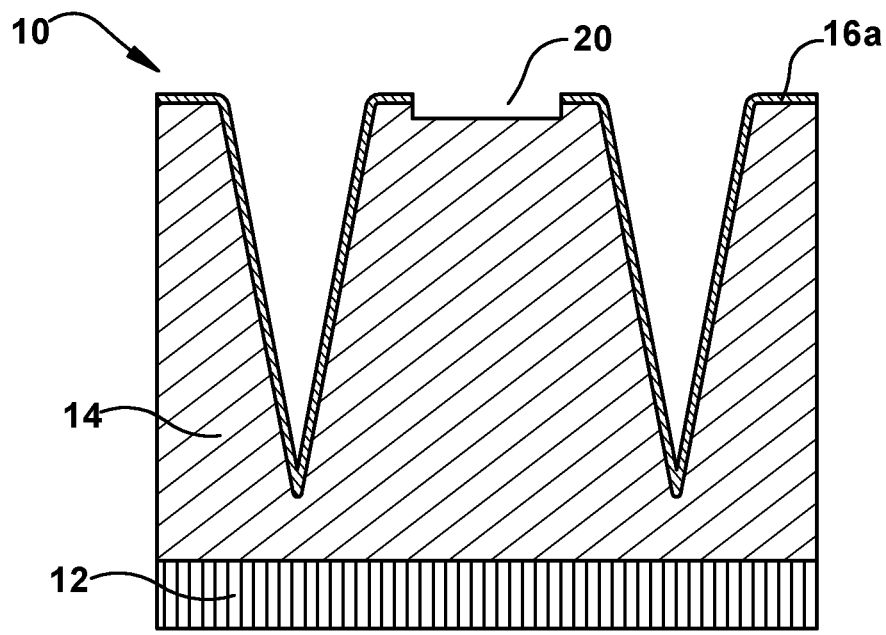
FIGS. 2A-2D are schematic cross-sectional views depicting exemplary process steps of forming an exemplary electrical device according to an embodiment.
Figure 2B:
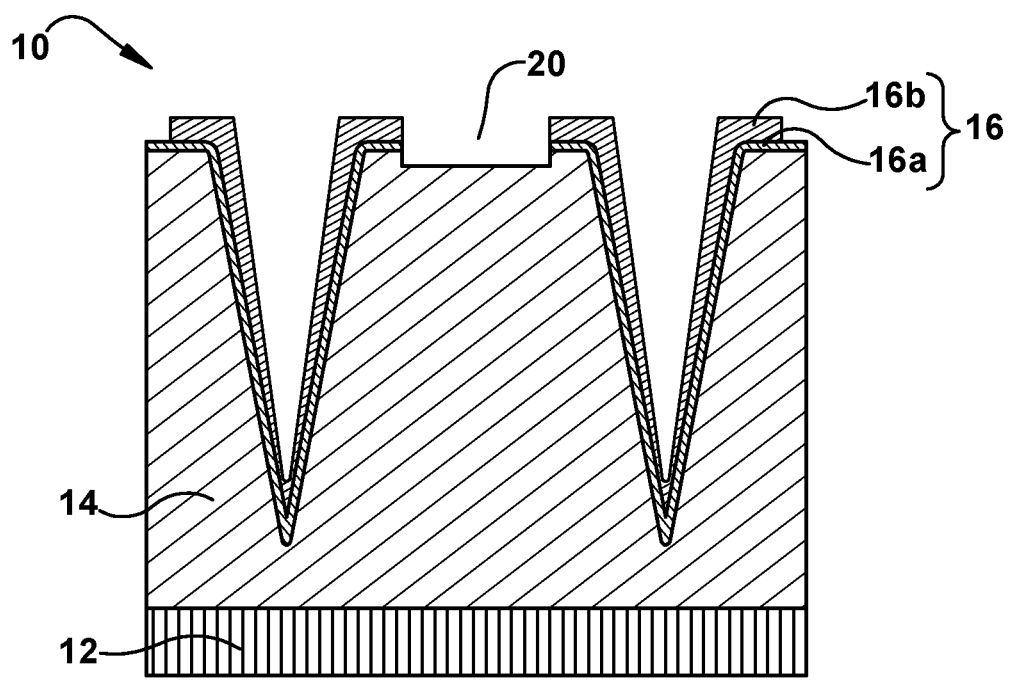
Figure 2C:
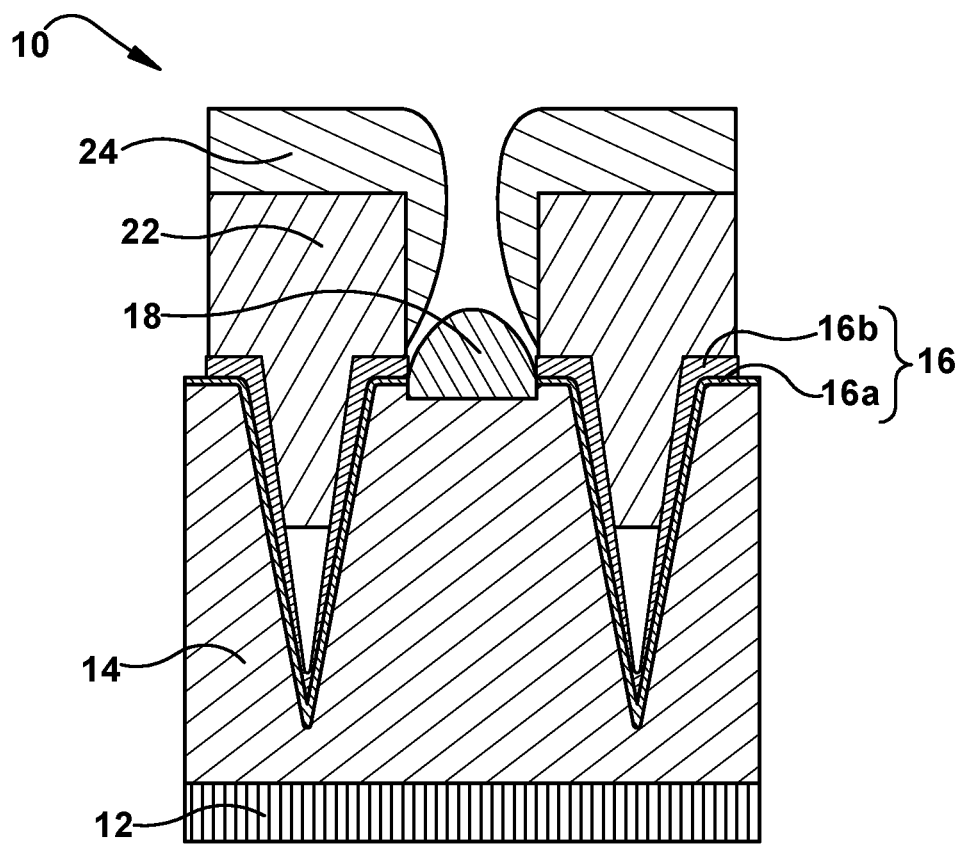
Figure 2D:
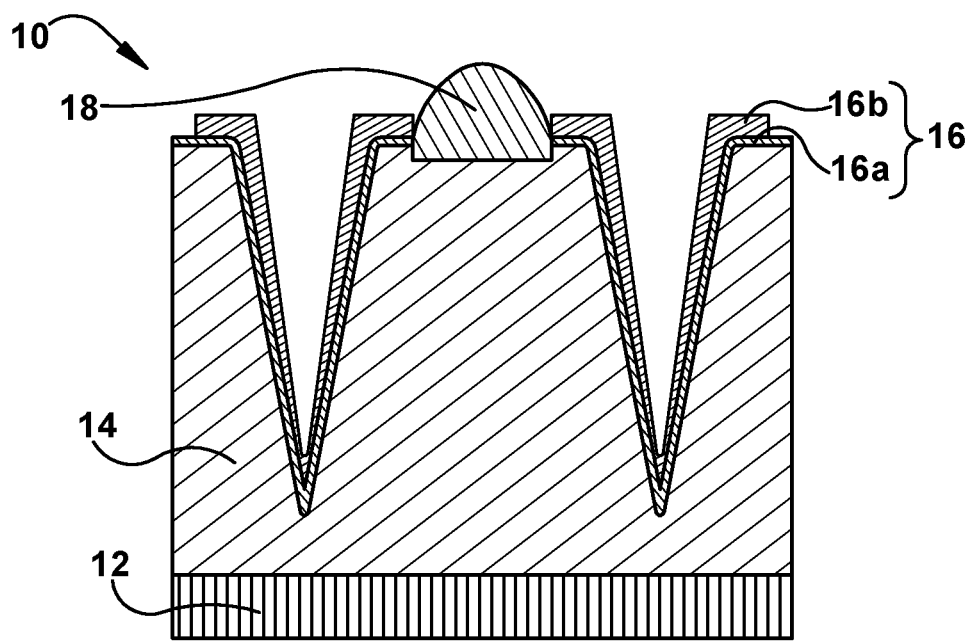

FIGS. 2A-2D are schematic cross-sectional views depicting exemplary process steps for forming an exemplary electrical device 10 according to the method 100. In the illustrated embodiment, particularly as shown in FIG. 2D, the semiconductor device 10 is a photodetector 10 that generally includes a substrate 12, a photoconductor layer 14 supported by the substrate 12, a passivation layer 16 overlying the photoconductor layer 14, and at least one electrical contact 18 that interfaces with the photoconductor layer 14. It is understood that the depiction of the photoconductor 10 is exemplary, and any suitable form of electrical device may be used in accordance with the principles and aspects disclosed herein.

Referring to FIG. 2A and step 102 in FIG. 1, the step of providing the substrate 12 includes providing any suitable substrate for the electrical device 10 as may be desired for a particular application. In exemplary embodiments, the substrate 12 is a semiconductor material such as silicon, or other semiconductor materials such as III-V and/or II-VI materials, for example. In the illustrated embodiment for the photodetector 10, the substrate 12 is a silicon substrate which provides a window for transmission of photons to the photoconductor layer 14.

Although not shown, subsequent to providing the substrate 12 and before forming the photoconductor layer 14, the process may include forming one or more buffer layers overlying the substrate 12. The buffer layer(s) may be epitaxy buffer layers to facilitate epitaxial growth of the photoconductor layer 14 with fewer defects and/or dislocations.

Still referring to FIG. 2A and step 104 in FIG. 1, the step of forming the photoconductor layer 14 may include any suitable material with any suitable technique. In the illustrated embodiment, the photoconductor layer 14 is mercury cadmium telluride ($Hg_{1-x}Cd_xTe$) ("MCT"). In exemplary embodiments, the photoconductor layer 14 (also referred to herein as the MCT photoconductor layer 14, or MCT layer 14) is grown epitaxially, such as via molecular beam epitaxy (MBE). The high-quality molecular beam epitaxial growth minimizes the number of dislocations and defects in the MCT photoconductor layer 14.

The MCT material has a chemical formula $Hg_{1-x}Cd_xTe$, which generally includes the compounds of cadmium telluride (CdTe) and mercury telluride (HgTe). The fraction (stoichiometric ratio) of Hg to Cd controls the optical absorption of the material, such that the MCT material has a tunable bandgap spanning the shortwave infrared to the very long wave infrared regions. This makes the MCT material unique in that it can react to absorption of infrared radiation in a large spectral range, including both of the accessible atmospheric windows from 3 to 5 μm (the mid-wave infrared window, MWIR), and from 8 to 14 μm (the long-wave window, LWIR).

The MCT material may be p-type or n-type depending on the dopant used in the MCT. For example, arsenic may be used for p-type doping and indium may be used for n-type. Other suitable dopants may include iodine or antimony. Generally, as a photoconductive material (i.e., photoconductor, photoresistor, or photosensitive material) the MCT layer 14 reacts to the absorption of electromagnetic radiation (e.g., visible, ultraviolet or infrared light) to become more electrically conductive. When a photoconductive material is connected as part of a circuit, the material functions as a resistor whose resistance depends on the light intensity. In this context, the material also is called a photoresistor (also called light-dependent resistor or photoconductor).

Figure 3A:
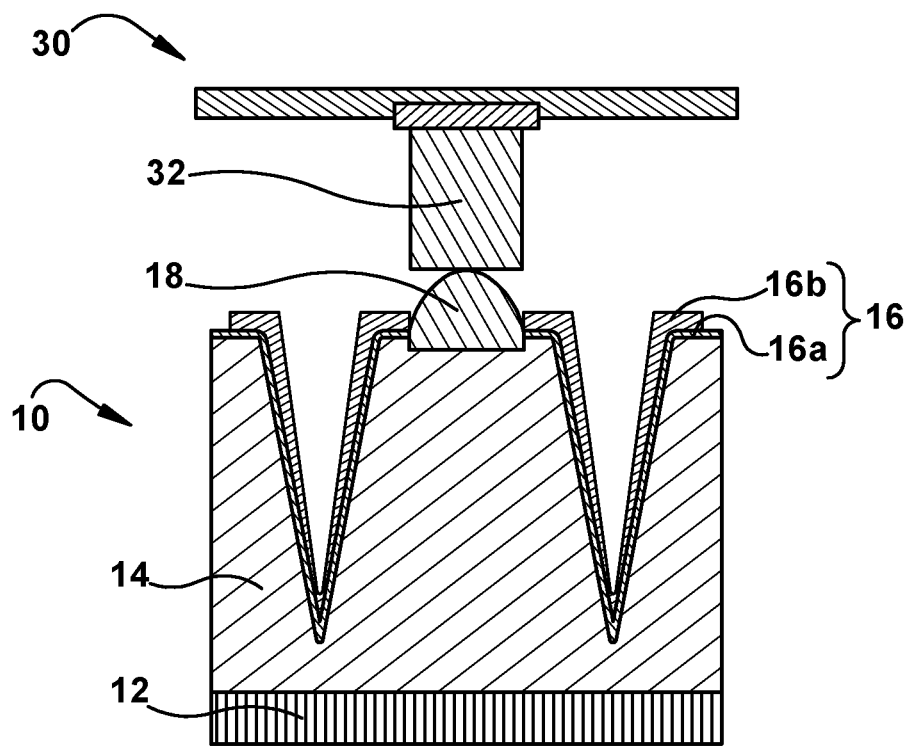
FIGS. 3A and 3B are schematic cross-sectional views depicting an exemplary process of integrating the exemplary electrical device in FIG. 2D to another exemplary electrical device.
Figure 3B:
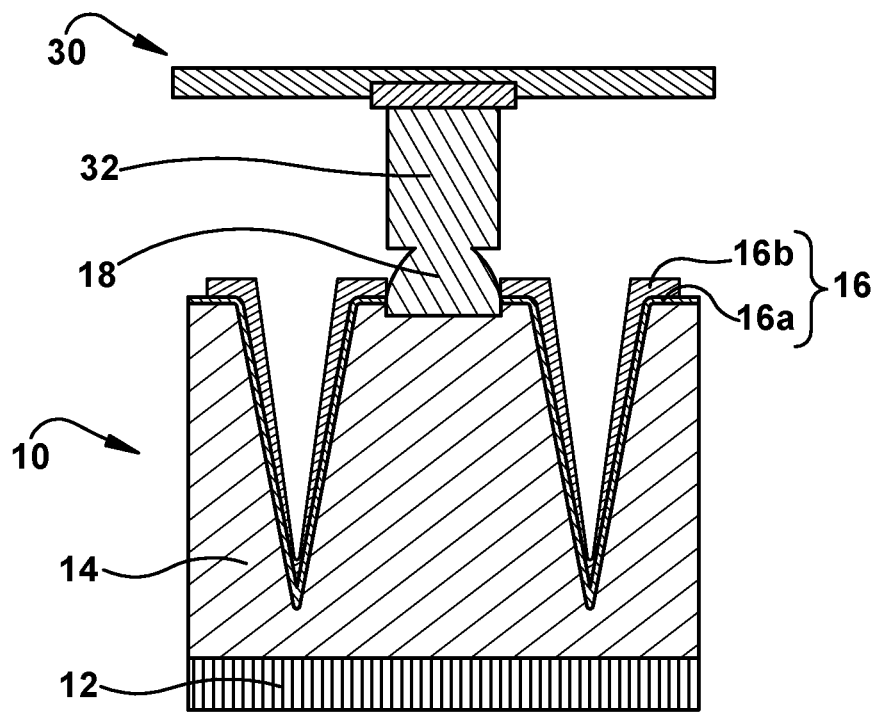

As a photoconductor in a photodetector, the MCT material in layer 14, whether n-type or p-type, couples with an opposite p-type or n-type material to form a p-n junction. The p-n junction may be formed using any suitable technique, such as layering within a mesa structure, ion implantation, ion beam milling, or the like. In the photodetector 10, the MCT photoconductor layer 14 uses a photovoltaic effect to produce photoelectric current in response to absorption of the light in a manner well-known in the art. In such materials, photoconductivity ensues when the photoconductive material 14 is bombarded with photons of sufficient energy to raise electrons across the material's band gap between the valence and conduction bands. More specifically, when an incident photon (e.g., IR photon) with sufficient energy is absorbed by the photoconductive material 14 (e.g., through a window in the substrate 12), the MCT photoconductor layer 14 reacts at the p-n junction to create a free electron-hole pair. At the p-n junction, the electrons migrate from the n-type doped material to the adjacent p-type material. The mobility of the charge carriers (e.g., an electron in an n-type material) will change the electrical resistance of the photoconductor material such that there is a voltage change across the device. This voltage change is proportional to the number of photo-generated charges, and thus measuring the change in voltage across the device provides a direct measure of the photons captured by the photoconductor material 14. The electrons generated will generally have sufficient mobility to travel via the electrical contact 18 of the device to a readout integrated circuit (ROIC) 30 (as shown in FIGS. 3A and 3B, for example), which such operation of a photodetector and ROIC is well-known in the art.

As shown in the illustrated embodiment, the device 10 is formed with mesa structures including p-n junctions. In the illustrated embodiment, for example, the p-n junction may be formed with the MCT layer 14 having a p-type MCT layer, or portion, doped with one material and an n-type MCT layer, or portion, doped with a different material. Such process may include diffusing a shallow, relatively high concentration, $N^+$ layer in a relatively low concentration, P region to form a P-N junction. To form the mesa structure, the MCT layer 14 may be etched using suitable masking techniques from the upper (e.g., $N^+$) region into the lower (e.g., P) region to form a plurality of mesa semiconductor structures, each having a P-N junction intersecting a sidewall of the mesa structure, in which each mesa forms a respective pixel of the photodetector 10. In the illustrated embodiment, the mesas each have a square pyramidal shape of about 2-8 microns in thickness, which increase in cross-sectional area from the upper surface downwardly toward the substrate 12. This forms a plurality of grooves within the structure, which in the illustrated embodiment are formed substantially as V-shaped grooves.

Still referring to FIG. 2A, following the formation of the MCT photoconductor layer 14 and mesa structure, at least one layer of the passivation layer 16 is formed atop the MCT photoconductor layer 14. Generally, the passivation layer 16 involves suitable coating with a dielectric material layer so that a reverse current-voltage characteristic of low leakage current, high voltage and good stability can be obtained. In the illustrated embodiment, the passivation layer 16 includes a first passivation layer 16a (FIG. 2A) and a second passivation layer 16b (FIG. 2B). FIG. 2A shows formation of the first passivation layer 16a, which in the illustrated embodiment is CdTe material deposited to about 2,000 Angstroms in thickness. The first passivation layer 16a may be deposited via any suitable process, such as via sputtering, atomic layer deposition, or evaporation techniques. As shown, the first passivation layer 16a covers an entire surface of the MCT layer 16, including the mesa sidewalls within the V-shaped grooves.

Following formation of at least a portion of the passivation layer 16, the device undergoes an elevated temperature anneal in a mercury environment to fill Hg vacancies in the MCT layer 14. Also as shown, contact windows 20 are opened atop the mesa structure to allow for formation of the electrical contact 18 therein (shown in FIG. 2D, discussed below).

Turning to FIG. 2B, formation of an aluminum nitride ($AlN_x$) layer as the second passivation layer 16b is shown. The second passivation layer 16b (also referred to as the aluminum nitride layer 16b or the AlN passivation layer 16b) cooperates with the first passivation layer 16a (e.g., CdTe layer) to form the overall passivation layer 16 of the device 10. As shown, the AlN passivation layer 16b is formed to overlie the passivation layer 16a (CdTe), including within the V-shaped grooves. In the illustrated embodiment, the first passivation layer 16a (CdTe) is configured to provide good electrical behavior with the directly interfacing MCT layer 14, and the AlN passivation layer 16b provides additional protection to the underlying MCT semiconductor material to provide a fully passivated MCT layer 14. It is understood, however, that in other embodiments, the AlN layer 16b may be directly formed onto the surface of the MCT in its as-grown state to provide the entirety of the passivation layer 16; or the AlN layer 16b may cooperate with other layers above or below the AlN layer 16b.

The AlN layer 16b is configured to have numerous advantages as a passivation layer to the underlying photoconductor material (MCT), including at least one or more of: (i) a small lattice constant and/or disoriented grain structure of the passivation film which can eliminate the possibility of epitaxy and misfit strain at the interface of the MCT, (ii) a similar coefficient of thermal expansion (CTE) as MCT, eliminating interface strain from CTE mismatch, (iii) chemical inertness in relation to Hg, Cd, and Te which eliminates thermodynamic drivers for reduction reactions and the problematic creation of free Hg near the interface (adhesion, unintentional doping, conduction), (iv) a large bandgap (about 6.2 eV) and high dielectric constant (about k=9) which make it an excellent electrical insulator, (v) a low positive fixed charge, both in its bulk and on its surface (vi) a good barrier to water vapor and other gases, enabling it to be stable over time and air exposure, to not be attacked by chemicals used in further fabrication of the device, and also protect the underlying MCT layer, (vii) can be deposited with a sufficiently non-porous structure to prevent gas diffusion and contamination to the underlying MCT layer, (vii) a high rigidity which makes it mechanically protective, and (vii) a very high thermal conductivity.

The AlN passivation layer 16b may be formed by any suitable process (e.g., PVD, CVD, ALD, etc.), and the conditions of such process may be adapted to provide one or more of the advantages of the AlN passivation layer 16b described above. In exemplary embodiments, the AlN passivation layer 16b is formed by a PVD reactive sputtering process in a PVD vacuum chamber. In such a process, the sputtering target is an aluminum (or aluminum alloy) target and the sputtering gas comprises argon (or other inert gas) and a nitrogen (reactive) gas. Generally, a negative charge is applied to the target via a power source, and high-velocity argon ions are accelerated into the negatively charged target liberate the aluminum atoms from the target which are directed toward the device 10. At the deposit surface of the device 10, the aluminum atoms react with the nitrogen atoms at the surface to form the AlN passivation layer 16b. The temperature of the AlN passivation layer 16b formation process may be controlled so that the device 10 (and particularly the MCT layer 14) does not exceed the thermal degradation temperature of the MCT material. For example, the temperature of AlN passivation layer 16b formation is controlled to below 150° C., and more preferably does not exceed 125° C. This is because the thermal degradation temperature of MCT at which properties of the material are deleteriously affected is in the range from 120° C. to 150° C.

In exemplary embodiments, the processing conditions during the AlN passivation layer 16b formation are adapted such that the AlN passivation layer 16 has low degree of crystal orientation, or an un-textured amorphous or disoriented polycrystalline structure. If polycrystalline, a preferred crystal structure may be the hexagonal (alpha) form with a Wurtzite structure. The aluminum nitride passivation layer 16b may have a columnar hexagonal polycrystalline structure with a weak (002) preferred orientation, such that it does not exhibit enough piezoelectric behavior to cause interference with the detector 10. The $AlN_x$ of the passivation layer 16 may be formed to be stoichiometric (x=1), near-stoichiometric (0.9<x<1.1), or non-stoichiometric (x<1). In preferred embodiments, the $AlN_x$ of the passivation layer 16 is formed to be stoichiometric or near-stoichiometric, such as via a "compound mode" or "poisoned target mode" of reactive-PVD deposition with a relatively low deposition rate (70 Å per kW-minute to about 150 Å per kilowatt-minute). The AlN passivation layer 16b may be formed with a suitable structure and thickness to provide a relatively rigid layer to provide additional protection to the MCT layer 14. For example, the thickness of the AlN passivation layer 16b may be in a range from 100 to 300 nm. The AlN passivation layer 16b may be formed to have a density of about 3.25 g/cc. The AlN passivation layer 16b may be formed to have a typical thermal conductivity in a range from 100-230 W/m-K, or about 40-80% of bulk AlN thermal conductivity (about 285 W/m-K). The AlN passivation layer 16b may be formed to have a low frequency dielectric constant with a range from about 4 to about 9, and more preferably about k=9. The AlN passivation layer 16b may be formed to have a band gap, Eg, of about 6.2 eV (direct). The AlN passivation layer 16b may be formed to have an index of refraction from 2.01 to 2.03, as measured by ellipsometry. The AlN passivation layer 16b may be formed to have an IR absorption of about 680 $cm^{-1}$.

In exemplary embodiments, the AlN passivation layer 16b is formed to have a coefficient of thermal expansion (CTE) that is a close match to that of the MCT photoconductor layer 14. For example, the AlN passivation layer 16b may be formed to have a CTE of about $4.6 \times 10^{-6}$/K to about $5.5 \times 10^{-6}$/K, whereas the MCT layer has a CTE of about $5.0 \times 10^{-6}$/K to about $5.6 \times 10^{-6}$/K. The same or similar CTE between the AlN passivation layer 16b and MCT layer 14 reduces or eliminates strain at an interface to the MCT layer 14, especially during elevated temperature fabrication (100-350° C.) or at low operating temperatures (−100 to −270° C.). Such matching of the CTEs between the AlN passivation layer 16b and the MCT layer 14 is particularly advantageous with the mesa structure of the device 10, as shown, because the relatively sharp bottoms of the V-shaped grooves can be high-stress areas that are prone to separation or delamination of the passivation layer 16. Such damaged areas could be prone to defect generation, contamination during subsequent processing steps (e.g., aqueous cleaning, etc.), or contamination during operation of the device, and the AlN passivation layer 16b with improved CTE matching helps to prevent such deleterious effects.

In exemplary embodiments, the processing conditions during the AlN passivation layer 16b formation are adapted such that the AlN passivation layer 16 has a neutral inherent stress, i.e., close to zero. For example, the neutral stress AlN passivation layer 16b may have a residual stress in a range from −50 MPa to +50 MPa, such as about −50, −40, −30, −20, −10, 0, +10, +20, +30, +40, or +50 MPa (including all values and subranges between the stated values), and more preferably within the range from −10 MPa to +10 MPa intrinsic stress. Such intrinsic stress values of the AlN passivation layer 16b may be modified by modifying the processing parameters of the deposition process. For example, the intrinsic stress value of the AlN passivation layer 16b can be modified during reactive PVD in the above-mentioned "compound mode" by varying the argon pressure during the process. A more detailed description of a process for providing variation in the intrinsic stress of AlN films is described in Applicant's co-pending U.S. application Ser. No. 16/998,235, filed Aug. 20, 2020, which is incorporated herein by reference.

Still referring to FIG. 2B, after deposition of the AlN passivation layer 16b, the contact windows 20 are re-opened, and the contacts to the MCT layer 14 are cleaned in preparation for forming the electrical contacts 18.

Turning to FIG. 2C, formation of the electrical contacts 18 within the windows 20 atop each mesa of the MCT layer 14 is shown. In the illustrated embodiment, a patterned photoresist 22 is applied over the window 20, and conductive materials are deposited to form a suitable electrical contact 18. As shown, the conductive material may form the electrical contact 18 in the form of a metal bump, and may include overburdened areas 24 atop the photoresist 22. The electrical contact 18 may be made of any suitable electrically conductive material, and preferable is formed of a suitable metal, such as indium, indium oxide, gold, chromium, platinum, titanium, a doped isotype semiconductor, or the like. Preferably the conductive material "bump" stack has a relatively low yield strength and high ductility, even at low temperature, and thus indium may be preferred. After formation of the electrical contact 18 (also referred to as a metal contact 18), the photoresist 22 and overburdened areas 24 are removed, such as by lift-off (i.e., dissolving the photo-resist layer so that the overburden is lifted away).

Referring to FIGS. 3A-3B, after the electrical contact 18 (metal bump) has been formed, the exemplary device 10 may be ready to be integrated with another electrical device 30. In the illustrated embodiment, where the semiconductor device 10 is a photodetector 10, the other electrical device 30 may be a readout integrated circuit (ROIC) (also referred to with reference numeral 30). The ROIC 30 may be conventional or may be specially adapted for the semiconductor device 10. As shown in the example, the ROIC 30 may include at least one redistribution interconnect 32 that electrically connect to the circuitry of the ROIC 30. The interconnect 32 (also referred to as a post) may be made of the same material as the contact 18, such as indium in the illustrated example.

As shown in FIG. 3A, the two electrical devices 10, 30 are aligned and point contacted between the metal contact 18 of the device 10 and the interconnect post 32 of the ROIC 30. This is done at room temperature (~25° C.) due to CTE mismatch between the ROIC and detector 10 chips, or at higher temperatures (greater than 157° C. to induce a melt weld between the indium post and the indium bump). At this point in processing, the AlN encapsulation of the MCT structure may make it more robust against thermal degradation or Hg loss.

FIG. 3B shows integration of the devices 10, 30 via the aligned point contact between indium structures with pressure applied. The AlN now acts as structural cladding to help prevent fracturing of mesa structures.

It is understood that although in this example the semiconductor device 10 is a photoconductor that is integrated with an ROIC, other semiconductor devices 10 may be coupled with other electrical devices. For example, the second electrical device 30 may be another semiconductor device of a different size, have a different function, or be made of different materials, all of which may be selected depending on the design considerations as understood by those having skill in the art. It is further understood that the exemplary electrical device 10 may be stacked and bonded (e.g., vertically stacked and hybrid or direct bonded) with a non-semiconductor device, or with other active or passive electrical devices.

Although the description herein provides particular reference to a semiconductor device having a mesa architecture, it also is understood that other structures of the electrical device may be provided, including semiconductors using ion implantation, ion beam milling, or the like. Moreover, the integration scheme described herein uses metal contact bumps for integrating with a read-out integrated circuit, however, it is understood that other integration techniques may be used, including 3D-integration with hybrid bonding, direct bonding, or the like, in which a bonding layer (e.g., bonding oxide) is used to integrate with another circuit (e.g., read out integrated circuit) and electrically connect via respective interconnect posts in each device.

An exemplary electrical device has been described herein which includes an aluminum nitride passivation layer for a mercury cadmium telluride ($Hg_{1-x}Cd_xTe$) (MCT) semiconductor layer of the device. Such an exemplary aluminum nitride ($AlN_x$) passivation layer overcomes one or more deficiencies of conventional passivation layers. For example, the aluminum nitride ($AlN_x$) passivation layer may resolve one or more problems associated with: (i) defects in MCT generated by interface strain at the MCT/passivation interface; (ii) dark current generated by carrier generation-recombination caused by strain-generated defects at the MCT/passivant interface; (iii) permeation of CdTe-only passivation by water vapor and residual processing chemicals causing unwanted electronic effects at the p-n junctions; and (iv) lack of mechanical support for finer pitch MCT mesa structures, enabling RT hybridization.

It is understood that all ranges and ratio limits disclosed in the specification and claims may be combined in any manner, including all values, ranges and subranges between the stated values. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

As used herein, positional or direction terms such as "upper", "lower", "top", "bottom," "left," "right," "horizontal," "vertical," etc. refer to an exemplary electrical device as viewed in a horizontal position, as shown in FIG. 2D, for example. This is done realizing that these devices can be oriented in various other positions when manufactured, when implemented in other electrical devices, when packaged, and the like.

As used herein, the terms "disposed on," "disposed onto," "deposited onto," "underlying," "overlying," or the like, refers to direct or indirect contact of one element with another element, whereas the term "directly on" or "directly onto" refers to direct contact of one element with another element, but not indirect contact between elements.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The transitional words or phrases, such as "comprising," "including," "carrying," "having," "containing," "involving," "holding," "made of/with," and the like, are to be understood to be open-ended, i.e., to mean including but not limited to, unless otherwise stated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical device comprising:
    a mercury cadmium telluride ($Hg_{1-x}Cd_xTe$) layer; and
    a passivation layer overlying the mercury cadmium telluride layer;
    wherein the passivation layer includes an aluminum nitride ($AlN_x$) passivation layer.

2. The electrical device according to claim 1, wherein the aluminum nitride passivation layer is configured to have neutral inherent stress in a range from −30 MPa to +30 MPa.

3. The electrical device according to claim 1, wherein a coefficient of thermal expansion (CTE) of the aluminum nitride passivation layer is within a range from zero to $2.0\times10^{-6}$/K of a CTE of the mercury cadmium telluride layer.

4. The electrical device according to claim 1, wherein the aluminum nitride passivation layer is an amorphous dielectric layer.

5. The electrical device according to claim 1, wherein the aluminum nitride passivation layer is a disoriented polycrystalline dielectric layer.

6. The electrical device according to claim 1, wherein the aluminum nitride passivation layer has a columnar hexagonal polycrystalline structure with a weak (002) preferred orientation, such that it does not exhibit enough piezoelectric behavior to cause interference with the electrical device.

7. The electrical device according to claim 1, wherein the aluminum nitride passivation layer is depositable at a temperature in a range from 25° C. to 150° C.

8. The electrical device according to claim 1, wherein the aluminum nitride passivation layer directly interfaces against the mercury cadmium telluride layer.

9. The electrical device according to claim 1, wherein an entirety of the passivation layer is the aluminum nitride passivation layer.

10. The electrical device according to claim 1, wherein the passivation layer further includes a cadmium telluride (CdTe) passivation layer.

11. The electrical device according to claim 10, wherein the cadmium telluride passivation layer is between the aluminum nitride passivation layer and the mercury cadmium telluride layer.

12. The electrical device according to claim 1, further comprising a substrate, and wherein the mercury cadmium telluride layer at least partially overlies the substrate.

13. The electrical device according to claim 1, further comprising a metal contact that interfaces with the mercury cadmium telluride layer.

14. The electrical device according to claim 1, wherein the electrical device is configured as a mesa semiconductor structure.

15. An integrated electrical device comprising:
    the electrical device according to claim 1, in which the electrical device is a photodetector; and
    a second electrical device that is a read out integrated circuit;
    wherein the first electrical device is bonded and electrically integrated to the second electrical device.

16. A mesa structure semiconductor device, comprising:
    a substrate,
    a mercury cadmium telluride ($Hg_{1-x}Cd_xTe$) layer overlying the substrate, the mercury cadmium telluride layer comprising a plurality of mesas each comprising at least one p-n junction;
    a passivation layer overlying and interfacing directly against the mercury cadmium telluride layer; and
    a plurality of metal contacts interfacing directly against the mercury cadmium telluride layer atop each of the plurality of mesas;
    wherein the passivation layer includes a cadmium telluride (CdTe) passivation layer and an aluminum nitride ($AlN_x$) passivation layer; and
    wherein the cadmium telluride passivation layer overlies and directly interfaces against the mercury cadmium telluride layer, and the aluminum nitride passivation layer overlies and interfaces directly against the cadmium telluride passivation layer.

17. A method of forming an electrical device, comprising:
    providing a substrate;
    forming a mercury cadmium telluride ($Hg_{1-x}Cd_xTe$) layer overlying the substrate; and
    forming an aluminum nitride ($AlN_x$) layer as a passivation layer overlying the mercury cadmium telluride layer.

18. The method of claim 17, wherein the mercury cadmium telluride layer is formed by molecular beam epitaxy.

19. The method of claim 17, wherein the aluminum nitride passivation layer is formed by reactive physical vapor deposition.

20. The method according to claim 17, wherein the aluminum nitride passivation layer is formed:
    (i) at a temperature in a range from 25° C. to 150° C.,
    (ii) to have a neutral intrinsic stress value in a range from −30 MPa to +30 MPa,
    (iii) to have a coefficient of thermal expansion in a range from $4.6\times10^{-6}$/K to about $5.5\times10^{-6}$/K, and
    (iv) to have an amorphous or disoriented polycrystalline dielectric structure, or has a columnar hexagonal polycrystalline structure with a weak (002) preferred orientation, such that it does not exhibit enough piezoelectric behavior to cause interference with the electrical device.

* * * * *